(12) United States Patent
Tang (10) Patent No.: US 12,419,033 B2
(45) Date of Patent: Sep. 16, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 529 days.

(21) Appl. No.: 17/816,440

(22) Filed: Aug. 1, 2022

(65) Prior Publication Data

US 2023/0403842 A1 Dec. 14, 2023

(30) Foreign Application Priority Data

Jun. 8, 2022 (CN) .......................... 202210646815.1

(51) Int. Cl.
*H10B 12/00* (2023.01)
(52) U.S. Cl.
CPC .............. *H10B 12/30* (2023.02); *H10B 12/03* (2023.02); *H10B 12/05* (2023.02)
(58) Field of Classification Search
CPC ........ H10B 12/30; H10B 12/03; H10B 12/05; H10B 12/482; H10B 12/488
See application file for complete search history.

(56) References Cited

U.S. PATENT DOCUMENTS

| 10,535,659 | B2 | 1/2020 | Kim et al. | |
| 2019/0103407 | A1* | 4/2019 | Kim | .......... H10B 12/30 |
| 2020/0411523 | A1* | 12/2020 | Shin | .......... H10B 12/02 |
| 2021/0125991 | A1* | 4/2021 | Kim | .......... H10D 1/714 |
| 2022/0045064 | A1* | 2/2022 | Jung | .......... H10B 12/482 |
| 2022/0285356 | A1* | 9/2022 | Son | .......... H01L 21/02603 |
| 2022/0352169 | A1* | 11/2022 | Kim | .......... H10B 12/03 |
| 2022/0352170 | A1* | 11/2022 | Lee | .......... H10D 1/714 |
| 2023/0301063 | A1* | 9/2023 | Yim | .......... H10B 12/30 |
| 2023/0397402 | A1* | 12/2023 | Lee | .......... H10B 12/30 |
| 2024/0224494 | A1* | 7/2024 | Lee | .......... H10B 12/03 |

FOREIGN PATENT DOCUMENTS

CN          109616474 A       4/2019

* cited by examiner

*Primary Examiner* — Steven B Gauthier
*Assistant Examiner* — E. Rhett Cheek
(74) *Attorney, Agent, or Firm* — Kilpatrick Townsend & Stockton LLP (57) ABSTRACT

Embodiments of the present disclosure provide a semiconductor structure and a manufacturing method thereof. The semiconductor structure includes: a base; a bit line; a word line; an active pillar, wherein the active pillar includes a source region, a channel region, and a drain region, the bit line is connected to one of the source region and the drain region of the active pillar, and the word line surrounds the channel region of the active pillar; a plurality of memory structures, wherein the memory structure is located between adjacent isolation layers, the memory structure includes a first electrode plate, a medium layer, and a second electrode plate that are sequentially stacked, the medium layer is located between the first electrode plate and the second electrode plate, the first electrode plate is connected to the other of the source region and the drain region of the active pillar.

9 Claims, 11 Drawing Sheets

SEMICONDUCTOR STRUCTURE AND MANUFACTURING METHOD THEREOF

CROSS-REFERENCE TO RELATED APPLICATIONS

This application claims the priority of Chinese Patent Application No. 202210646815.1, submitted to the Chinese Intellectual Property Office on Jun. 8, 2022, the disclosure of which is incorporated herein in its entirety by reference.

TECHNICAL FIELD

Embodiments of the present disclosure relate to the field of semiconductors, and in particular, to a semiconductor structure and a manufacturing method thereof.

BACKGROUND

With the continuous development of integrated circuit manufacturing technologies, in order to improve an integration degree of an integrated circuit, improve an operating speed of a memory, and reduce a power consumption of the memory, a metal-oxide-semiconductor field-effect transistor (MOSFET) device continuously reduces its feature size, and faces a series of challenges. For example, in order to reduce a device linewidth, a semiconductor structure has begun to develop from an embedded word line structure to a gate-all-around (GAA) structure. However, an integration degree of a memory device is mainly determined by an area occupied by a unit memory cell, in other words, a storage capacity of the memory device is also limited by a size of the memory device.

How to reduce the device linewidth and further increase the memory density has become an important problem to be solved by the technical personnel in this field urgently.

SUMMARY

Embodiments of the present disclosure provide a semiconductor structure and a manufacturing method thereof.

According to some embodiments of the present disclosure, an aspect of the embodiments of the present disclosure provides a method of manufacturing a semiconductor structure, including: providing a base; forming active pillars, and a bit line that extends along a first direction, wherein the bit line is located on a surface of the base, the active pillars are arranged at intervals along a direction perpendicular to the surface of the base, the active pillars each include a source region, a channel region, and a drain region, and the bit line is electrically connected to one of the source region and the drain region of the active pillar; forming a word line extending along a second direction, wherein the word line is located between adjacent active pillars and surrounds the channel region of the active pillar; forming isolation layers and sacrificial layers, wherein the isolation layers are arranged at intervals along the direction perpendicular to the surface of the base, and each sacrificial layer is located between adjacent isolation layers; patterning end portions of the isolation layer and the sacrificial layer along a third direction, and thinning a part of the sacrificial layer along a width direction; forming an isolation layer and a dielectric layer, wherein the dielectric layer is located on the surface of the base, the dielectric layer is further located between adjacent isolation layers, and along the third direction, the isolation layer is located between the word line and the dielectric layer, and removing the sacrificial layer; forming a plurality of memory structures, wherein each memory structure is located between adjacent isolation layers; the memory structure includes a first electrode plate, a medium layer, and a second electrode plate; the medium layer is located between the first electrode plate and the second electrode plate; the first electrode plate is electrically connected to the other of the source region and the drain region of the active pillar, and the first electrode plate surrounds a part of the second electrode plate.

According to some embodiments of the present disclosure, another aspect of the embodiments of the present disclosure further provides a semiconductor structure, including: a base, wherein a bit line that extends along a first direction are provided on a surface of the base; active pillars, wherein the active pillars are arranged at intervals along a direction perpendicular to the surface of the base, the active pillars each include a source region, a channel region, and a drain region, and the bit line is electrically connected to one of the source region and the drain region of the active pillar; a word line extending along a second direction, wherein the word line is located between adjacent active pillars and surrounds the channel region of the active pillar; isolation layers and dielectric layers, wherein the dielectric layers are located on the surface of the base, the isolation layers are arranged at intervals along the direction perpendicular to the surface of the base, each dielectric layer is further located between adjacent isolation layers, and along the third direction, the isolation layer is located between the word line and the dielectric layer; and a plurality of memory structures, wherein each memory structure is located between adjacent isolation layers; the memory structure includes a first electrode plate, a medium layer, and a second electrode plate that are stacked sequentially; the medium layer is located between the first electrode plate and the second electrode plate; the first electrode plate is electrically connected to the other of the source region and the drain region of the active pillar, and the first electrode plate surrounds a part of the second electrode plate.

BRIEF DESCRIPTION OF THE DRAWINGS

One or more embodiments are exemplified by corresponding accompanying drawings, and these exemplified descriptions do not constitute a limitation on the embodiments. The accompanying drawings are not limited by scale unless otherwise specified. To describe the technical solutions in the embodiments of the present disclosure or in the prior art more clearly, the following outlines the drawings to be used in the embodiments of the present disclosure. Evidently, the drawings outlined below are merely some embodiments of the present disclosure. Those of ordinary skill in the art may derive other drawings from the outlined drawings without making any creative effort.

DETAILED DESCRIPTION

Embodiments of the present disclosure provide a semiconductor structure and a manufacturing method thereof. The semiconductor structure includes a plurality of memory structures; the memory structure is electrically connected to a source region or a drain region of an active pillar; the memory structure is located between adjacent isolation layers; the isolation layers are arranged at intervals along a direction perpendicular to a surface of a base, and the plurality of memory structures are arranged along the direction perpendicular to the surface of the base. That is, a memory part of the semiconductor structure is a 3D semiconductor device, which can improve the integration density or capacity of memory devices.

The embodiments of the present disclosure are described in detail below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 1:
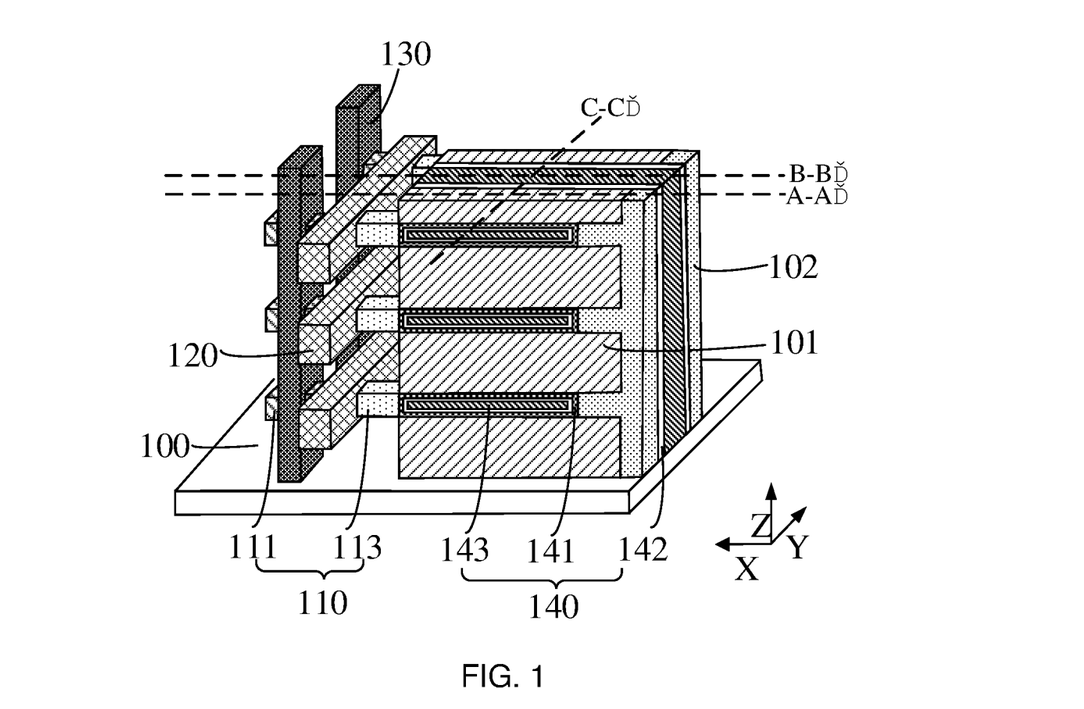
FIG. 1 is a schematic structural diagram of a semiconductor structure according to an embodiment of the present disclosure.
Figure 2:
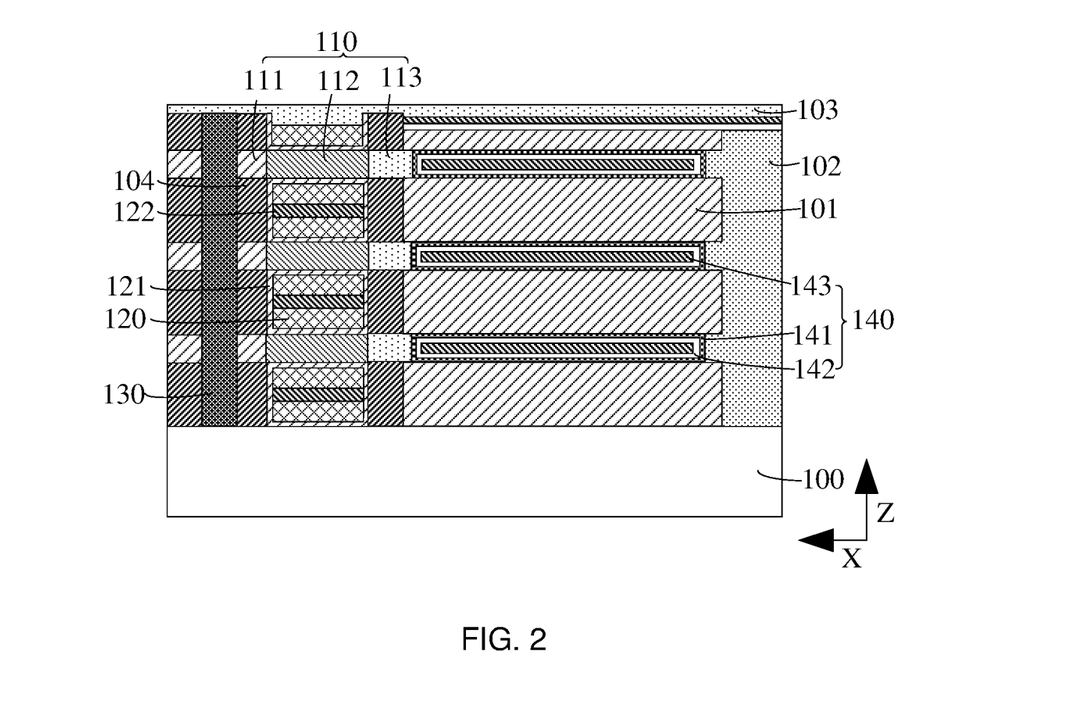
FIG. 2 is a schematic structural cross-sectional diagram of a semiconductor structure along a cross section A-A' according to an embodiment of the present disclosure.
Figure 3:
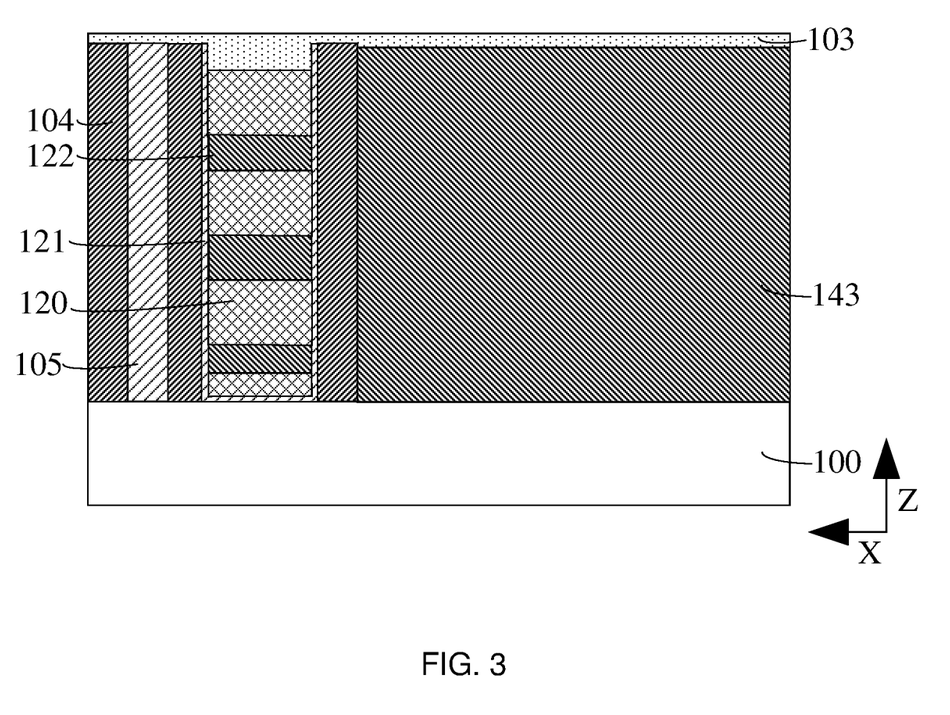
FIG. 3 is a schematic structural cross-sectional diagram of a semiconductor structure along a cross section B-B' according to an embodiment of the present disclosure.
Figure 4:
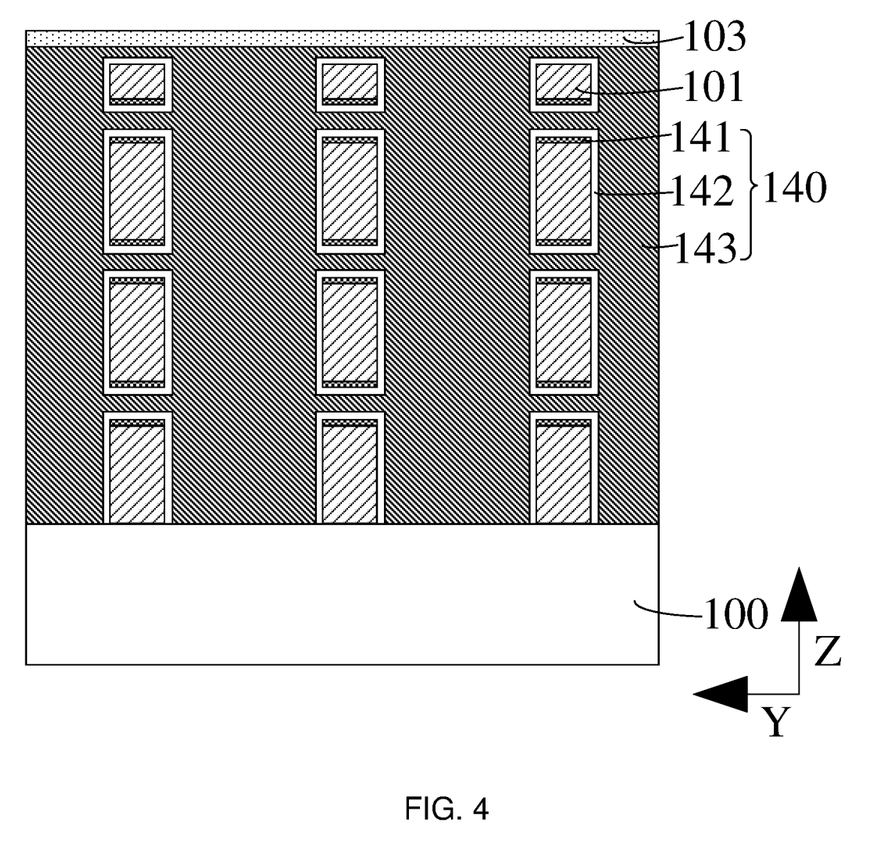
FIG. 4 is a schematic structural cross-sectional diagram of a semiconductor structure along a cross section C-C' according to an embodiment of the present disclosure.

FIG. 1 is a schematic structural diagram of a semiconductor structure according to an embodiment of the present disclosure; FIG. 2 is a schematic structural cross-sectional diagram of a semiconductor structure along a cross section A-A' according to an embodiment of the present disclosure; FIG. 3 is a schematic structural cross-sectional diagram of a semiconductor structure along a cross section B-B' according to an embodiment of the present disclosure; and FIG. 4 is a schematic structural cross-sectional diagram of a semiconductor structure along a cross section C-C' according to an embodiment of the present disclosure.

According to some embodiments of the present disclosure, an aspect of the embodiments of the present disclosure provides a semiconductor structure, including: a base 100, where a bit line 130 extending along a first direction (direction Z perpendicular to the base 100) is provided on a surface of the base 100; active pillars 110, where the active pillars 110 are arranged at intervals along a direction perpendicular to the surface of the base 100, the active pillars 110 each include a source region 111, a channel region 112, and a drain region 113, and the bit line 130 is electrically connected to the source region 111 of the active pillar; word lines 120 extending along a second direction (direction Y parallel to the surface of the base 100), where each word line 120 is located between adjacent active pillars 110 and surrounds the channel region 112 of the active pillar 110; isolation layers 101 and dielectric layers 102, where the dielectric layers 102 are located on the surface of the base 100, the isolation layers 101 are arranged at intervals along the direction perpendicular to the surface of the base 100, and the isolation layer 101 is located between the word line 120 and the dielectric layer 102; and a plurality of memory structures 140, where each memory structure 140 is located between adjacent isolation layers 101; the memory structure 140 includes a first electrode plate 141, a medium layer 142, and a second electrode plate 143 that are stacked sequentially; the medium layer 142 is located between the first electrode plate 141 and the second electrode plate 143; the first electrode plate 141 is electrically connected to the drain region 113 of the active pillar 110, and the first electrode plate 141 surrounds a part of the second electrode plate 143.

In some embodiments, a material of the base 100 may be a semiconductor material. The semiconductor material specifically may be any one from the group consisting of silicon, germanium, silicon germanide, or silicon carbide. In other embodiments, the bit line extends along direction Y parallel to the surface of the base. The word line extends along direction Z perpendicular to the surface of the base; the bit line is connected to the drain region of the active pillar, and the first electrode plate of the memory structure is connected to the source region of the active pillar.

In some embodiments, the bit line 130 may be a metal bit line, and a material of the bit line 130 may be tungsten, copper, molybdenum, silver, or other metal. The metal has low resistance, which helps improve the conductivity of the bit line 130 and the active pillar 110. In other embodiments, the bit line 130 may be a semiconductor bit line, and a material of the semiconductor bit line may be silicon, germanium, silicon germanide, silicon carbide or polysilicon. Moreover, the semiconductor bit line is doped with an element of the same type as the element doped in the active pillar 110. The dopant element may be used as carriers, to facilitate migration and diffusion of carriers between the bit line 130 and the active pillar 110, thereby helping improve the conductivity of the bit line 130 and the active pillar 110.

In some embodiments, the word line 120, the channel region 112 of the active pillar 110, and the source region 111 and the drain region 113 of the active pillar 110 that are located at two ends of the channel region 112 form a transistor structure. Along a direction from the source region 111 to the drain region 113, at least two transistor structures are provided. Two transistor structures are electrically connected to the same bit line 130, such that the two transistor structures share the bit line 130; in addition, along direction X parallel to the base 100, the memory structure 140 located at another terminal of the transistor structure may share the same bit line 130. In this way, the embodiments of the present disclosure can implement 3D stacking, and reduce the size of the critical device by sharing the bit line 130, thereby improving the performance of the semiconductor device and the stability of the semiconductor structure.

In some embodiments, the word line 120 is used as a gate of the semiconductor structure, and the word line 120 surrounds the channel region 112 of the active pillar 110, that is, the semiconductor structure is a GAA structure. In the GAA structure, the gate can surround the channel region of the semiconductor on all sides, which can desirably solve the problems such as leakage current, capacitance effect, and short channel effect due to reduced spacing between gates, and reduce the area occupied by the word line 120 in the vertical direction, thereby helping improve the gate control performance and the integration of the semiconductor structure.

In some embodiments, a material of the word line 120 is any one from the group consisting of tungsten, tantalum, molybdenum, titanium nitride or tantalum nitride, to form a metal gate line. In other embodiments, the material of the word line is doped polycrystalline silicon. The polycrystalline silicon has a similar energy gap with the material of the active pillar that serves as a channel, and a work function of the polycrystalline silicon can be changed by controlling a doping concentration, which helps reduce a threshold voltage between the gate and the channel region of the active pillar. A dopant element type of the doped polycrystalline silicon is the same as or different from a dopant element type of the channel region of the active pillar.

In some embodiments, the memory structure 140 may be a capacitor structure, and the semiconductor structure may form a one-transistor one-capacitor (1T-1C) structure. With a limited device cell area, the area occupied by the memory structure is maximized, which helps improve the memory density. The first electrode plate 141 is used as a bottom electrode plate of the capacitor structure, and the second electrode plate 143 may be used as a top electrode plate of the capacitor structure. The second electrode plate 143 may be a common electrode of a plurality of capacitor structures. The memory structure 140 may be used as a memory element configured to store data. The first electrode plate 141 may be in direct contact with the drain region 113 of the active pillar 110 to implement electrical connection between the active pillar 110 and the capacitor structure. In other embodiments, the electrical connection between the first electrode plate 141 and the drain region 113 of the active pillar 110 is achieved through a metal silicide. The contact resistance between the first electrode plate 141 and the active pillar 110 can be effectively reduced by using the silicide, which can reduce the signal delay caused by the charging and discharging process of the resistor (R)-controlled capacitor (C) in the integrated circuit, thus improving the electrical performance of the semiconductor structure. The metal silicide may be palladium silicide, platinum silicide, or cobalt silicide.

A material of the first electrode plate 141 may be titanium, titanium nitride, ruthenium, cobalt, nickel or tungsten. A material of the medium layer 142 may be any one or more from the group consisting of silicon oxide, silicon nitride, or a high-K material. The high-K material may include hafnium oxide, zirconium oxide, aluminum oxide, lanthanum oxide, titanium oxide, tantalum oxide, niobium oxide or strontium titanate. A material of the second electrode plate 143 may be titanium, titanium nitride, ruthenium, cobalt, nickel or tungsten. In other embodiments, the second electrode plate may include a first sub-electrode plate and a second sub-electrode plate that are sequentially stacked. A material of the first sub-electrode plate may be titanium, titanium nitride, ruthenium, cobalt, nickel or tungsten, and a material of the second sub-electrode plate may be doped polycrystalline silicon or undoped polycrystalline silicon.

In some embodiments, the isolation layer 101 achieves functions of isolating the memory structure in an insulated manner and supporting the memory structure, and a material of the isolation layer 101 may be silicon nitride, silicon oxide, or other high-K materials. The high-K material may include hafnium oxide, zirconia, aluminum oxide, lanthanum oxide, titanium oxide, tantalum oxide, niobium oxide or strontium titanate. The dielectric layer 102 supports the memory structure 140 and the isolation layer 101. A material of the dielectric layer 102 may be a carbon-oxygen compound, a silicon-oxygen compound, a silicon-nitrogen compound, a silicon-nitrogen-oxygen compound or other low-K material, so as to reduce the parasitic capacitance capacity between adjacent memory structures 140, and reduce the leakage current of the integrated circuit and the signal crosstalk between adjacent memory structures 140, thus allowing the semiconductor structure to have a higher level of integration. For example, the carbon-oxygen compound specifically may be silicon carbon oxide; the silicon-oxygen compound specifically may be silicon oxide; the silicon-nitrogen compound specifically may be silicon nitride; the silicon-nitrogen-oxygen compound specifically may be silicon oxycarbonitride; and the low-K material specifically may be silicon oxide or a polyimide nano material.

In some embodiments, the first electrode plate 141 is located on a side surface of the dielectric layer 102; along an arrangement direction of the source region 111 and the drain region 113, a width of the dielectric layer 102 located on a side surface of the first electrode plate 141 is greater than or equal to a width of the dielectric layer 102 located on a side surface of the isolation layer 101. In this way, it is ensured that the first electrode plate 141 is located between adjacent isolation layers 101, so that along the direction perpendicular to the surface of the base 100, there is no electrical connection between first electrode plates 141, ensuring the 1T1C structure. The dielectric layer 102 located between adjacent isolation layers 101 is also used as a support layer, to ensure the stability of the semiconductor structure. Specifically, a difference between the width of the dielectric layer 102 located on the side surface of the first electrode plate 141 and the width of the dielectric layer 102 located on the side surface of the isolation layer 101 ranges from 5 nm to 20 nm, and specifically may be 5 nm, 13 nm, 18.2 nm or 19.6 nm. This difference range ensures that there is no electrical connection between first electrode plates 141 and the area of the memory structure 140 is as large as possible, such that the dielectric layer 102 is wide enough to serve as a support layer to support the isolation layer and the memory structure.

In some embodiments, the isolation layers 101 are further arranged at intervals along the second direction. Along the second direction, the second electrode plate 143 is located between adjacent isolation layers 101; the medium layer 142 is located between the second electrode plate 143 and the isolation layer 101. The dielectric layers 102 are arranged at intervals along the second direction; the second electrode plate 143 is located between adjacent dielectric layers 102. The second electrode plate 143 extends along the extension direction of the word line 120 and the direction perpendicular to the surface of the base 100, and has a large enough area, which helps improve the memory density.

In some embodiments, along the second direction, the side surface of the first electrode plate 141 is flush with the side surface of the isolation layer 101. Along the second direction, a width of the first electrode plate 141 is less than or equal to a width of the isolation layer 101; along the direction perpendicular to the surface of the base 100, there is no electrical connection between adjacent first electrode plates 141 to avoid failure of the memory structure 140.

In some embodiments, the semiconductor structure further includes: an insulation layer 103, where the insulation layer 103 is located on top surfaces of the memory structures 140, the word lines 120 and the bit line 130; and a first isolation layer 104, where the first isolation layer 104 is located between the word line 120 and the memory structure 140 and between the word line 120 and the bit line 130. A material of the first isolation layer 104 may be silicon nitride, silicon oxide, or other high-K material. The high-K material may include hafnium oxide, zirconia, aluminum oxide, lanthanum oxide, titanium oxide, tantalum oxide, niobium oxide or strontium titanate. A material of the insulation layer 103 is silicon oxide, silicon nitride or silicon carbon oxide.

In some embodiments, the semiconductor structure further includes: a gate dielectric layer 121, where the gate dielectric layer 121 is located between the word line 120 and the channel region 112 and between the word line 120 and the isolation layer 101; and a second isolation layers 122, where the second isolation layer 122 is located between adjacent word lines 120 along direction Z perpendicular to the surface of the base 100. A material of the gate dielectric layer 121 may be silicon oxide, silicon carbide, silicon nitride or other high-K materials, to suppress the short channel effect, thereby suppressing the tunneling leakage current and the like. The second isolation layer 122 is configured to isolate adjacent word lines 120, to avoid short circuit caused by electrical connection between adjacent word lines 120. A material of the second isolation layer 122 may be silicon oxide, silicon carbide, or silicon nitride.

In the technical solution provided by the embodiments of the present disclosure, the semiconductor structure includes a plurality of memory structures 140; the memory structure 140 is electrically connected to a source region 111 or a drain region 113 of an active pillar 110; the memory structure 140 is located between adjacent isolation layers 101; the isolation layers 101 are arranged at intervals along a direction perpendicular to a surface of a base 100, and the plurality of memory structures 140 are arranged along the direction perpendicular to the surface of the base 100. That is, a memory part of the semiconductor structure is a 3D semiconductor device, which can improve the integration density or capacity of memory devices.

In addition, the word line 120 surrounds the channel region 112 of the active pillar 110, that is, the semiconductor structure is a GAA structure. In the GAA structure, the gate can surround the channel region of the semiconductor on all sides, which can desirably solve the problems such as leakage current, capacitance effect, and short channel effect due to reduced spacing between gates, and reduce the area occupied by the word line in the vertical direction, thereby helping improve the gate control performance and the integration of the semiconductor structure.

Correspondingly, an embodiment of the present disclosure further provides a method of manufacturing a semiconductor structure, which may be used to manufacture the semiconductor structure as shown in FIG. 1 to FIG. 4. Contents same as or corresponding to those in the above embodiment will not be described again.

FIG. 5 to FIG. 20 are schematic structural diagrams corresponding to various steps of a method of manufacturing a semiconductor structure according to an embodiment of the present disclosure. FIG. 5 to FIG. 13 are schematic structural cross-sectional diagrams corresponding to various steps of a method of manufacturing a semiconductor structure along a cross section A-A' according to an embodiment of the present disclosure. FIG. 14 to FIG. 20 are schematic structural cross-sectional diagrams corresponding to various steps of a method of manufacturing a semiconductor structure along a cross section C-C' according to an embodiment of the present disclosure. The method of manufacturing a semiconductor structure provided by this embodiment is described in detail below with reference to the accompanying drawings.

Referring to FIG. 5 to FIG. 20, the method includes: providing a base 100; forming active pillars 110, and a bit line 130 that extends along a first direction (direction Z perpendicular to the surface of the base 100), where the bit line 130 is located on a surface of the base 100, the active pillars 110 are arranged at intervals along a direction perpendicular to the surface of the base 100, the active pillars 110 each include a source region 111, a channel region 112, and a drain region 113, and the bit line 130 is electrically connected to the source region 111 of the active pillar; forming word lines 120 extending along a second direction (direction Y parallel to the surface of the base 100), where each word line 120 is located between adjacent active pillars 110 and surrounds the channel region 112 of the active pillar 110; forming isolation layers 101 and sacrificial layers, where the isolation layers 101 are arranged at intervals along the direction perpendicular to the surface of the base 100, and each sacrificial layer is located between adjacent isolation layers 101; patterning end portions of the isolation layers 101 and the sacrificial layers along a third direction (direction X parallel to the surface of the base 100), and thinning the sacrificial layers by partial width; forming dielectric layers 102, where the dielectric layers 102 are located on the surface of the base 100, each dielectric layer 102 is further located between adjacent isolation layers 101, and along the third direction, the isolation layer 101 is located between the word line 120 and the dielectric layer 102; forming memory structures 140, where each memory structure 140 is located between adjacent isolation layers 101; the memory structure 140 includes a first electrode plate 141, a medium layer 142, and a second electrode plate 143; the medium layer 142 is located between the first electrode plate 141 and the second electrode plate 143; the first electrode plate 141 is electrically connected to the drain region 113 of the active pillar 110, and the first electrode plate 141 surrounds a part of the second electrode plate 143.

Figure 5:
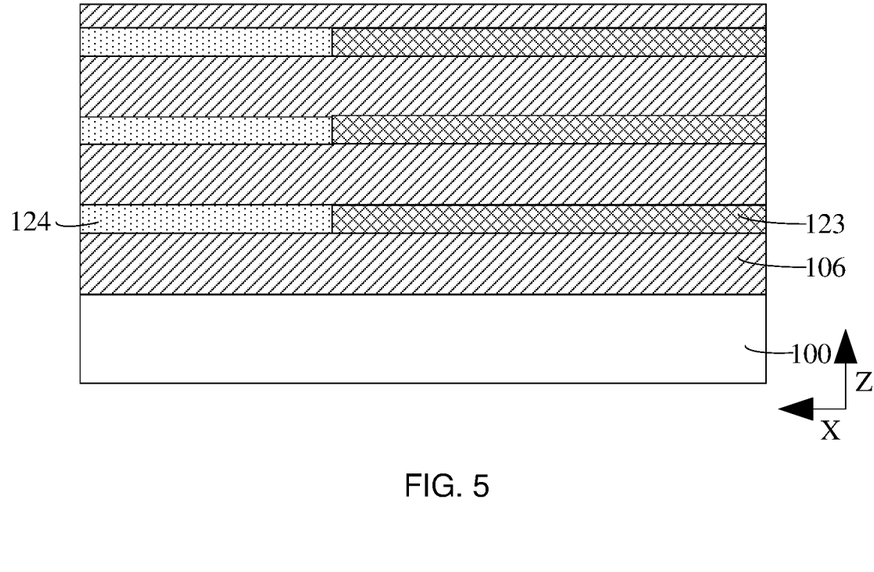
FIG. 5 to FIG. 20 are schematic structural diagrams corresponding to various steps of a method of manufacturing a semiconductor structure according to an embodiment of the present disclosure.
Figure 14:
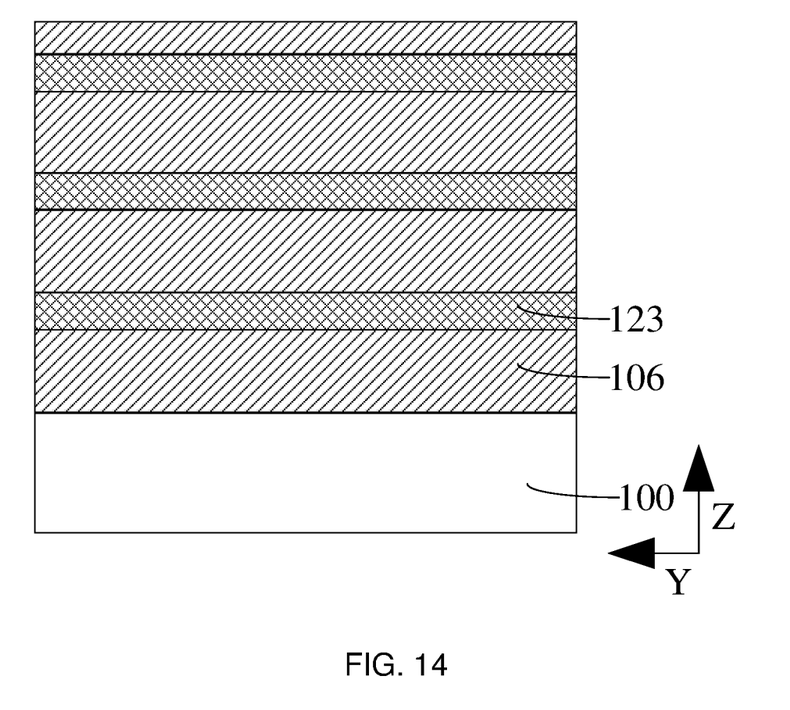

Specifically Referring to FIG. 5 and the FIG. 14, first sacrificial films 106 and semiconductor films arranged at intervals are sequentially formed on the surface of the base 100.

In some embodiment, the base 100 may be an initial base. The base 100 may be made of a semiconductor material. The semiconductor material specifically may be any one from the group consisting of silicon, germanium, silicon germanide, or silicon carbide. A ration of a thickness of the first sacrificial film 106 to a thickness of the semiconductor film ranges from 10:1 to 1:1, and specifically may be 9:1, 6.3:1, 5:2 or 1.6:1. A region where the first sacrificial film 106 is located is configured to form the word line and the first isolation layer of the transistor structure, and a region where the semiconductor film is located is configured to form the active pillar and the memory structure. The ratio range of the thickness of the first sacrificial film 106 to the thickness of the semiconductor film can ensure a relative large area of the word line and a relatively large area of the memory structure, thereby improving the control capability of the word line and increase the memory area. A material of the first sacrificial film 106 may be silicon germanide, silicon oxide or silicon nitride.

In some embodiments, in the process of forming the semiconductor film, a part of the semiconductor film in a width direction is doped to form a first semiconductor film 123, and the remaining semiconductor film is used as a second semiconductor film 124. The first semiconductor film 123 and the second semiconductor film 124 have different etching selectivity ratios, and the second semiconductor film 124 is used to form the active pillar. A material of the first semiconductor film 123 and a material of the first sacrificial film 106 have different etching selectivity ratios, and a material of the second semiconductor film 124 and the material of the first sacrificial film 106 have different etching selectivity ratios. The first semiconductor film 123 and the second semiconductor film 124 may be made of any one from the group consisting of silicon, germanium, or polysilicon. A dopant element in the first semiconductor film 123 may be an N-type element or a P-type element. The N-type element may be a group V element such as phosphorus (P), bismuth (Bi), antimony (Sb) or arsenic (As), and the P-type element may be a group III element such as boron (B), aluminum (Al), gallium (Ga) or indium (In). In other embodiments, the second semiconductor film may be doped. The second semiconductor film with the dopant element can improve the conductivity of the active pillar, thereby improving the electrical performance of the semiconductor structure. In other embodiments, the material of the first semiconductor film is different from that of the second semiconductor film, and the material of the first semiconductor film and the material of the second semiconductor film have different etching selectivity ratios.

In some embodiments, a mask layer (not shown in the figure) is formed on the surface of a part of the first sacrificial film 106. A material of the mask layer and a material of the first sacrificial film 106 have different etching rates; the material of the mask layer and a material of the semiconductor film have different etching rates. The material of the mask layer includes silicon nitride, silicon oxycarbonitride, silicon carbide or silicon carbon oxide. A region covered by the mask layer is configured to form the transistor structure and the bit line; the mask layer is configured to avoid damage on the second semiconductor film 124 during forming of the memory structure.

Figure 6:
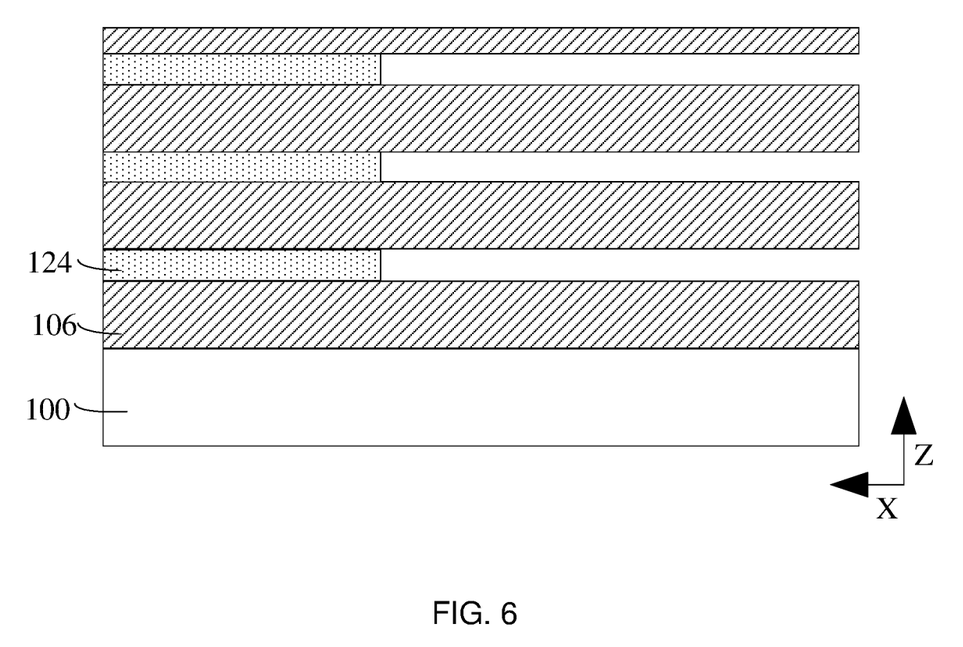
Figure 15:
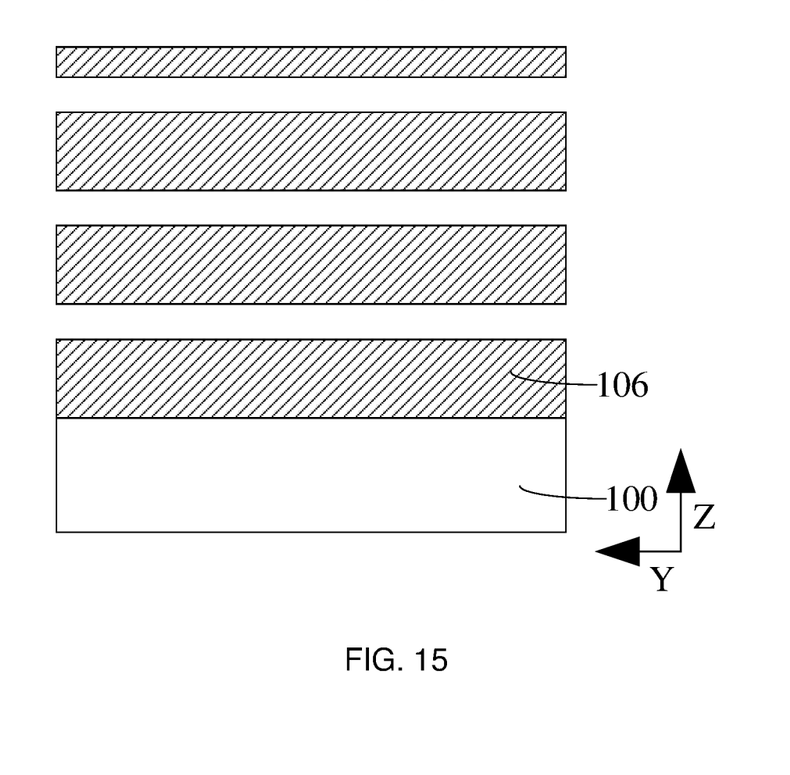

Referring to FIG. 6 and FIG. 15, the first semiconductor film 123 is etched (referring to FIG. 5). The first semiconductor film 123 is etched by using a wet selective etching process. In some embodiments, the material of the first semiconductor film 123 is silicon; in this case, the wet etching solution is an alkaline solution, such as potassium hydroxide. In other embodiments, the material of the first semiconductor film 123 is polysilicon; in this case, the wet etching solution is an acid solution, such as nitric acid.

Figure 7:
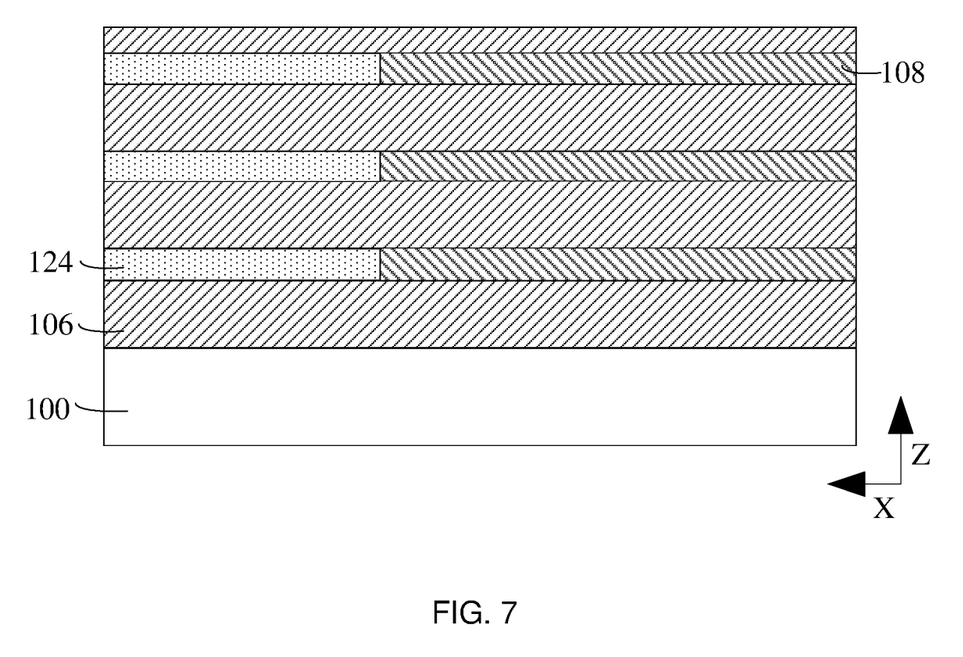
Figure 16:
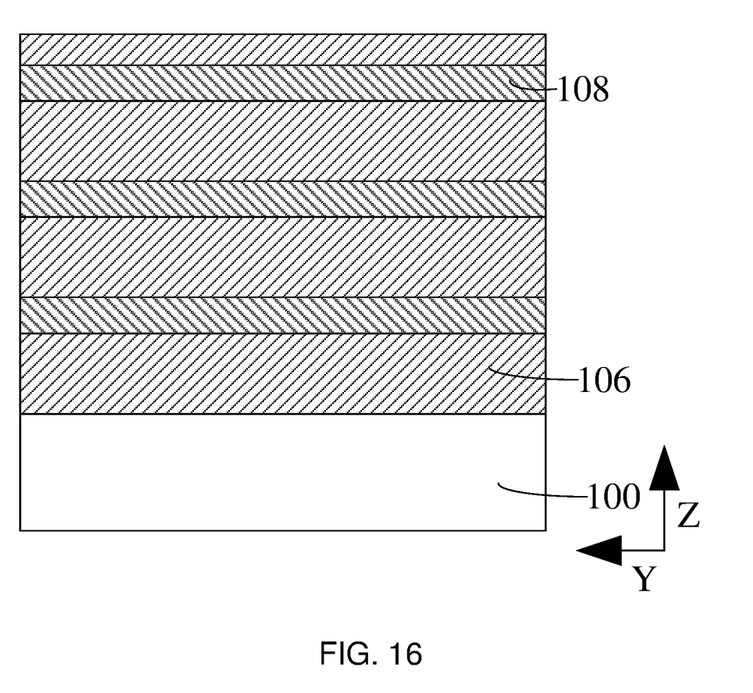

Referring to FIG. 7 and FIG. 16, a second sacrificial film 108 is formed, where the second sacrificial film 108 is located between adjacent first sacrificial films 106, and the second sacrificial film 108 is used as a sacrificial layer. A material of the second sacrificial film 108 may be silicon oxide, silicon carbide, or silicon nitride.

Figure 8:
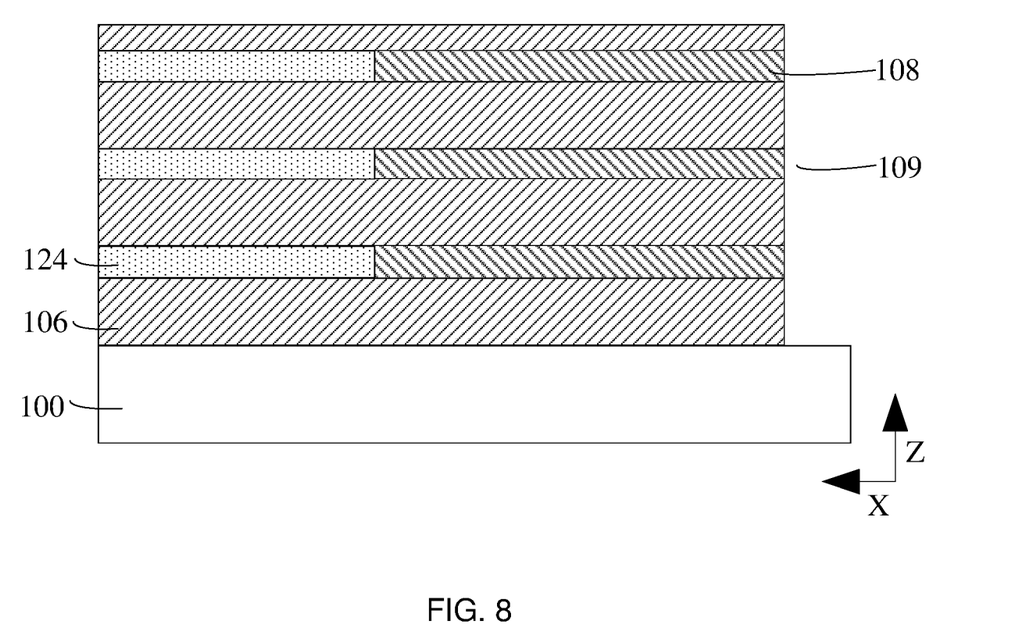

Referring to FIG. 8, along the third direction (direction X parallel to the surface of the base 100), end portions of the first sacrificial film 106 and the second sacrificial film 108 are patterned to form a second groove 109, where a bottom of the second groove 109 exposes the base 100. A side surface of the second groove 109 exposes end surfaces of the first sacrificial film 106 and the second sacrificial film.

In some embodiments, along direction X parallel to the surface of the base 100, a width of the second groove 109 ranges from 30 nm to 100 nm, and specifically may be 30 nm, 56 nm, 68 nm, or 89 nm. The dielectric layer subsequently formed in the second groove 109 is used as the support layer of the capacitor structure. The width of the second groove 109 may be considered as the width of the dielectric layer, and a width range or thickness range of the dielectric layer is sufficient to support the capacitor structure, to avoid deformation of the capacitor structure. Meanwhile, based on the material characteristic of the dielectric layer, the capacity of the parasitic capacitance between adjacent memory structures can be reduced, to reduce the leakage current of the integrated circuit and the problem of signal crosstalk between adjacent memory structures, thereby allowing the semiconductor structure to have a higher level of integration.

Figure 9:
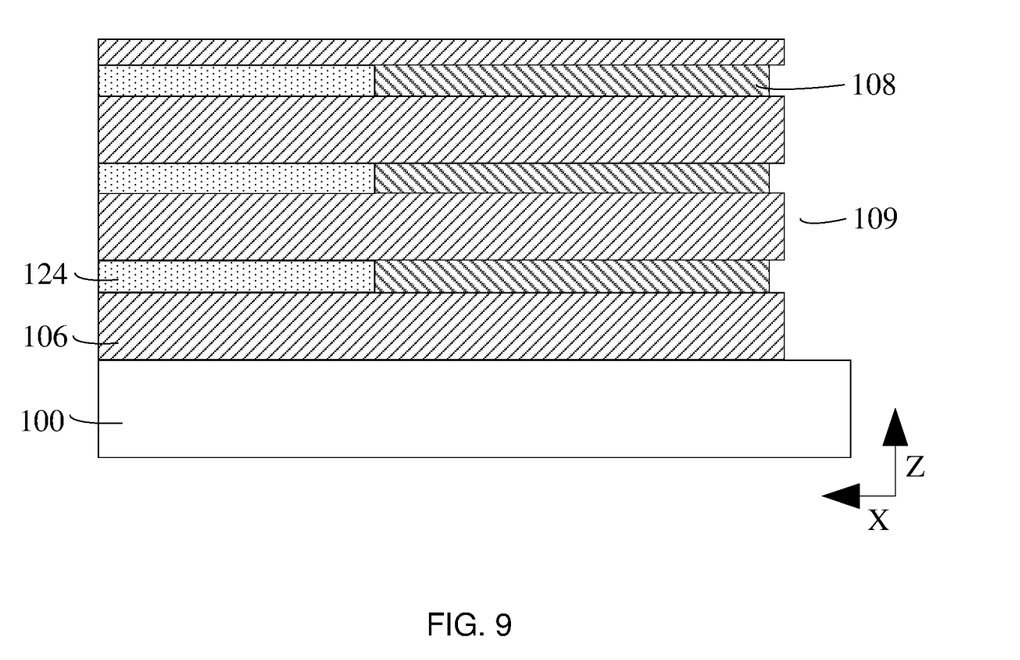

Referring to FIG. 9, along the third direction (direction X parallel to the surface of the base 100), a part of the second sacrificial film 108 along a width direction is thinned, to ensure that the formed dielectric layer can support the first sacrificial film 106 when the second sacrificial film is subsequently removed through etching, to avoid collapsing of the first sacrificial film 106.

In some embodiments, the width of the thinned second sacrificial film 108 ranges from 5 nm to 20 nm, and specifically may be 5 nm, 13 nm, 18.2 nm, or 19.6 nm. This width range ensures that there is no electrical connection between the subsequently formed first electrode plates and the area of the memory structure is as large as possible, thereby improving the memory density of the semiconductor structure.

Figure 10:
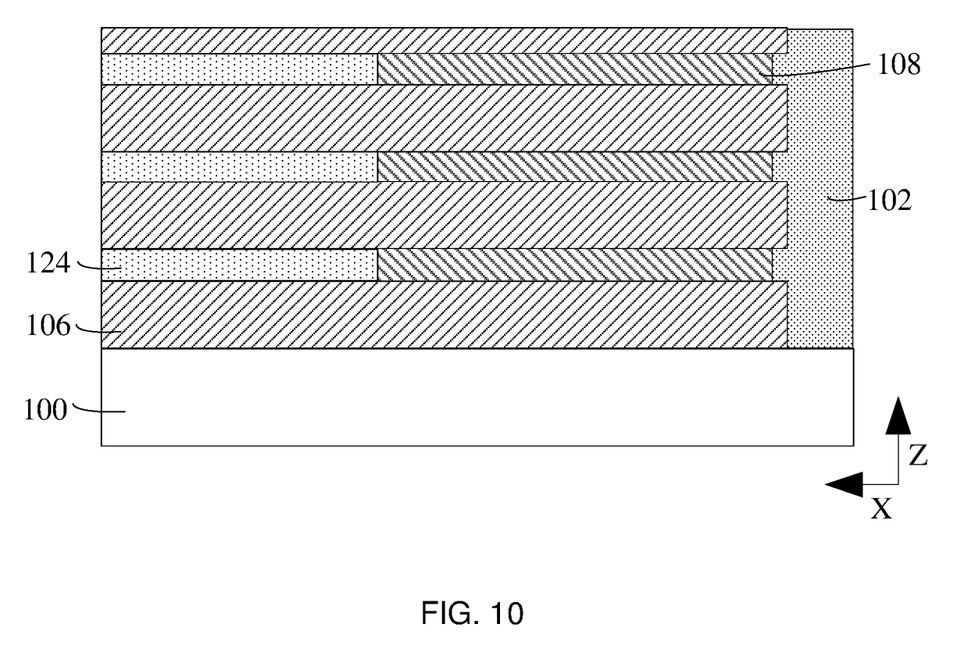

Referring FIG. 10, the dielectric layer 102 is formed in the second groove 109 (referring to FIG. 9). A material of the dielectric layer 102 includes silicon nitride, silicon oxycarbonitride, silicon carbide, silicon carbon oxide or other low-K materials.

Referring to FIG. 11 to FIG. 13 and FIG. 17 to FIG. 20, along the cross section B-B', the first sacrificial film 106, the semiconductor film, and the dielectric layer 102 are patterned to form a first groove, where a bottom of the first groove exposes the initial base; a part of the semiconductor film along a width direction is etched to form a capacitive region, and a first electrode plate 141, a medium layer 142, and a second electrode plate 143 are sequentially formed in the capacitive region and the first groove.

Figure 11:
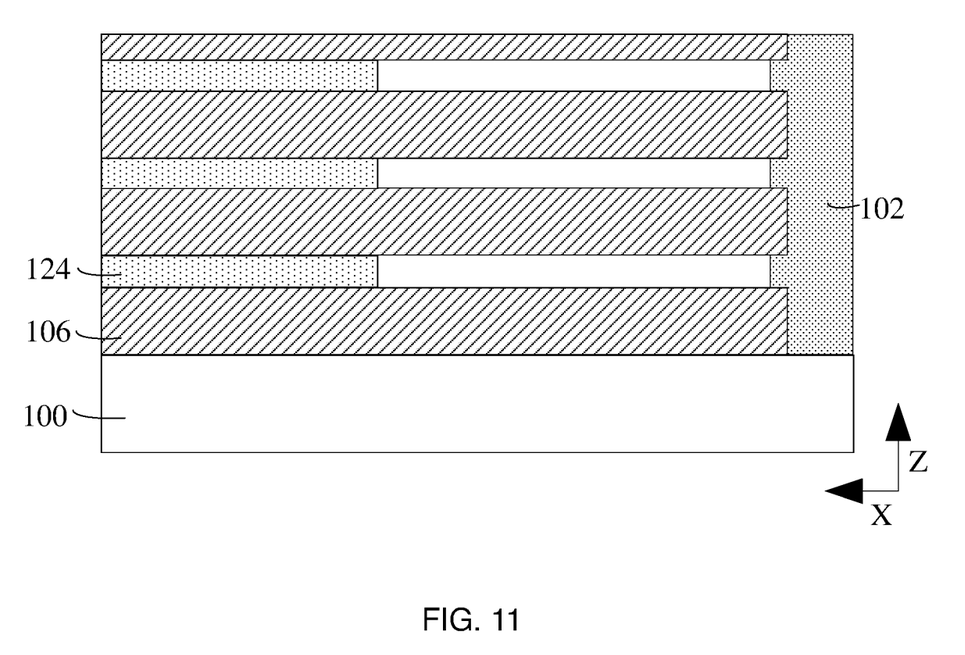
Figure 17:
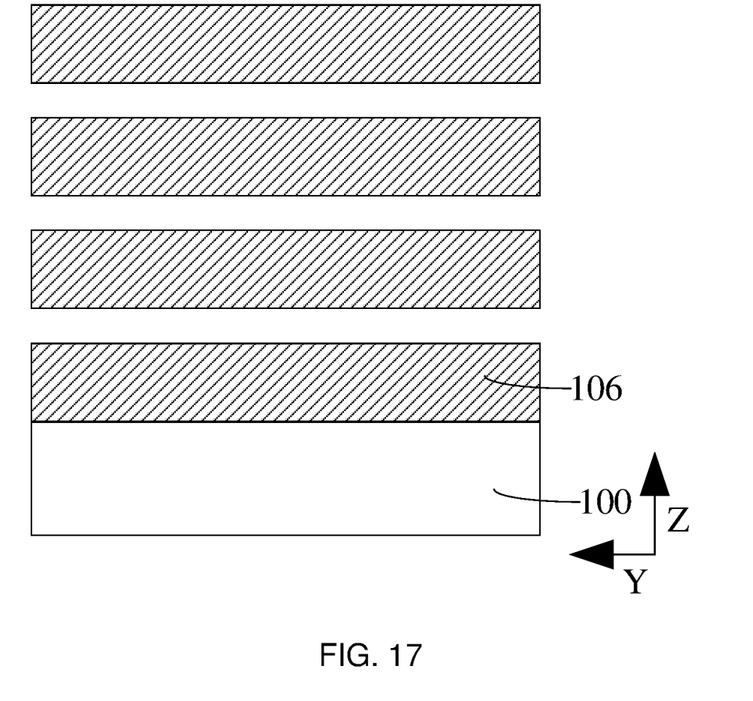

Specifically, referring to FIG. 11 and FIG. 17, the second sacrificial film 108 is removed through etching to form the capacitive region.

Figure 12:
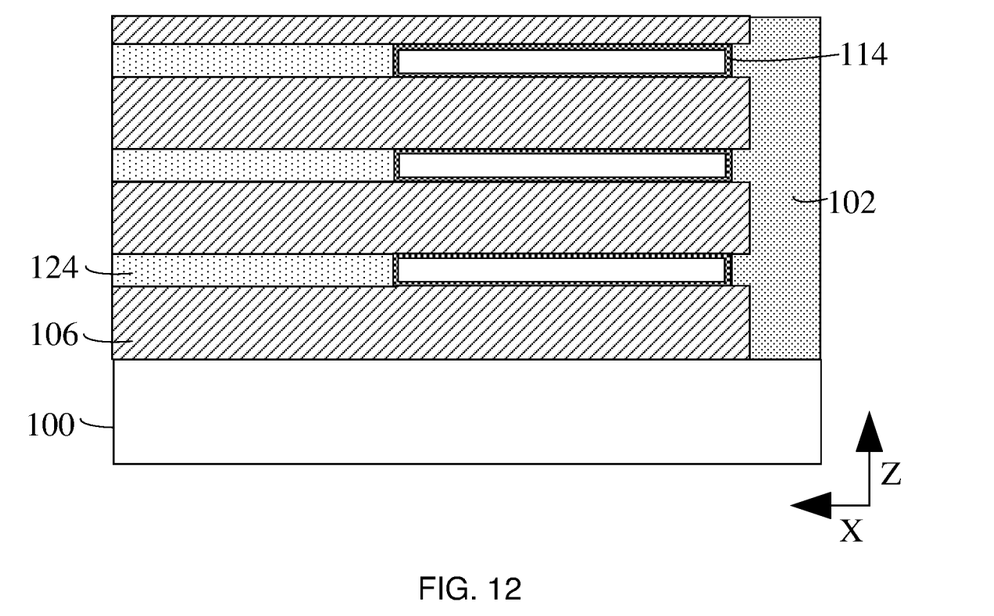
Figure 18:
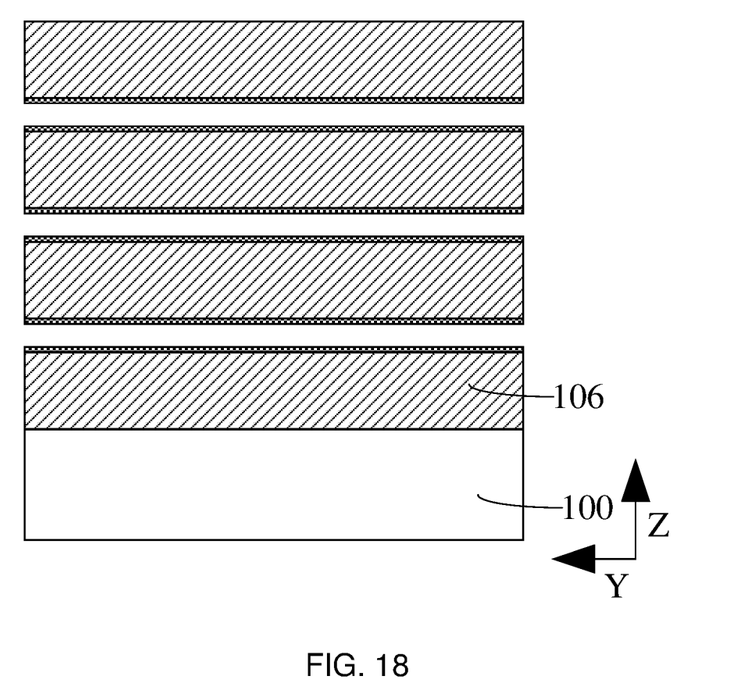

Referring to FIG. 12 and FIG. 18, a conductive layer 114 is formed on surfaces of the second semiconductor film 124, the first sacrificial film 106, and the dielectric layer 102.

Figure 13:
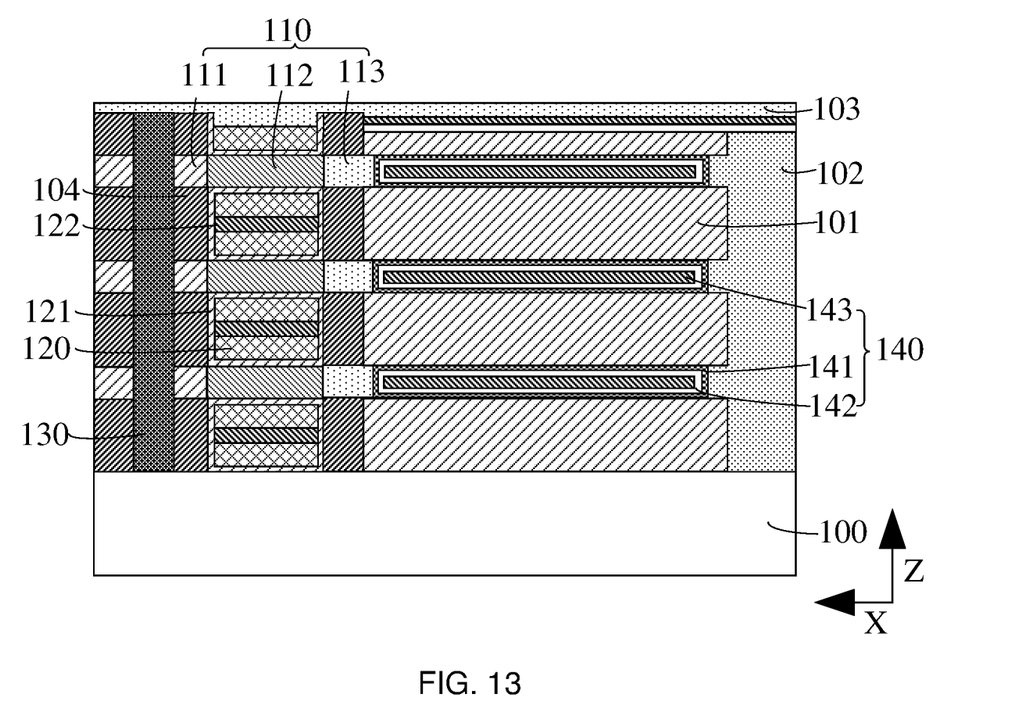
Figure 19:
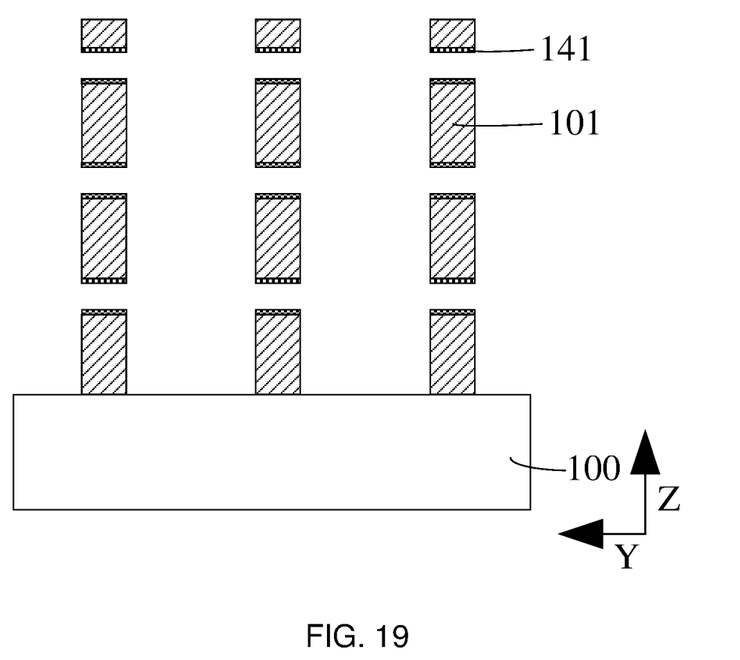

In some embodiments, referring to FIG. 13 and FIG. 19, the first sacrificial film 106 (referring to FIG. 12) and the dielectric layer 102 (referring to FIG. 12) of the cross section B-B' (referring to FIG. 1) are removed through etching to form the first groove. At the same time, a part of the conductive layer 114 (referring to FIG. 12) is removed through etching, where the remaining conductive layer 114 (referring to FIG. 12) is used as the first electrode plate 141 (referring to FIG. 13), and the remaining first sacrificial film 106 (referring to FIG. 12) is used as the isolation layer 101 (referring to FIG. 13).

Figure 20:
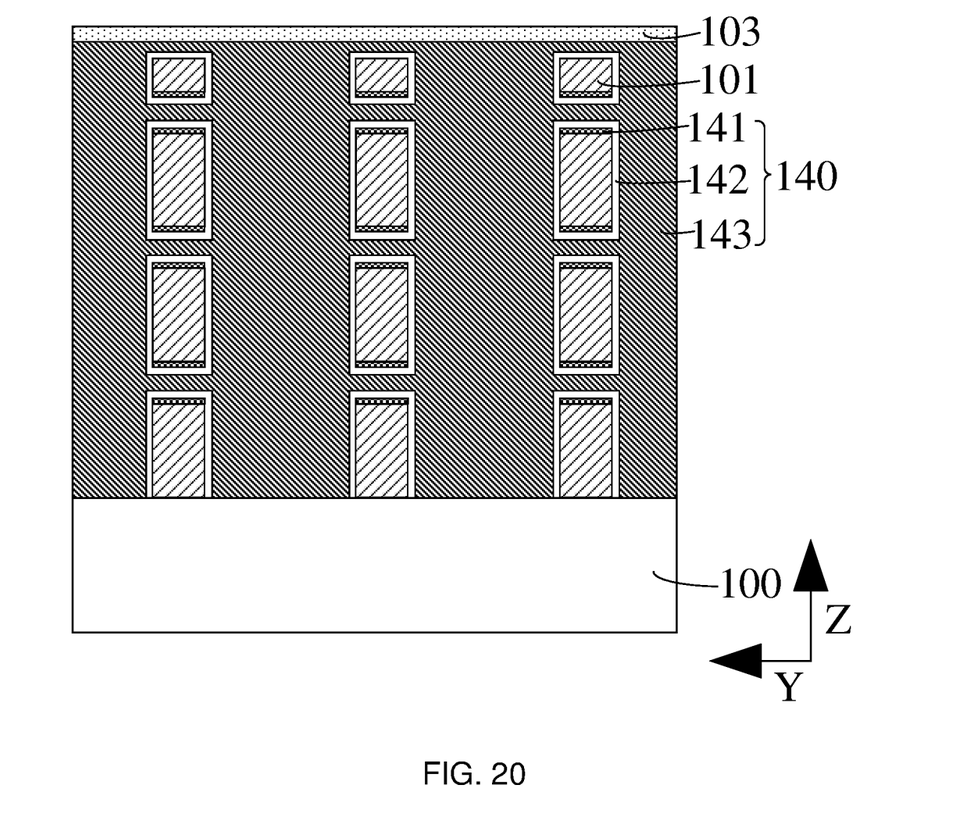

Referring to FIG. 13 and FIG. 20, the medium layer 142 and the second electrode plate 143 are sequentially formed in the capacitive region and the first groove; and the active pillar 110, the bit line 130, and the word line 120 are formed.

In some embodiments, the method of manufacturing a semiconductor structure further includes: forming a gate dielectric layer 121, where the gate dielectric layer 121 is located between the word line 120 and the channel region 112 and between the word line 120 and the isolation layer 101, and the gate dielectric layer 121 is formed before the word line 120 is formed. A material of the gate dielectric layer 121 may be silicon oxide, silicon carbide, silicon nitride or other high-K materials, to suppress the short channel effect, thereby suppressing the tunneling leakage current and the like.

In some embodiments, the step of forming word lines 120 includes: forming a conductive film, where the conductive film surrounds the second semiconductor film 124 (referring to FIG. 12), and etching the conductive film to form word lines 120 that are arranged at intervals; forming second isolation layers 122, where each second isolation layer 122 is located between adjacent word lines 120 along direction Z perpendicular to the surface of the base 100 to isolate the adjacent word lines 120, so as to avoid short-circuit caused by an electrical connection between the adjacent word lines 120. A material of the second isolation layer 122 may be silicon oxide, silicon carbide, or silicon nitride.

In the foregoing description, the manufacturing method is described with an example in which the memory structure is formed before the transistor structure is formed. In other embodiments, the transistor structure may be formed before the memory structure is formed. The bit line extends along direction Y parallel to the surface of the base. The word line extends along direction Z perpendicular to the surface of the base; the bit line is electrically connected to the drain region of the active pillar, and the first electrode plate of the memory structure is electrically connected to the source region of the active pillar.

Those of ordinary skill in the art can understand that the above implementations are specific embodiments for implementing the present disclosure. In practical applications, various changes may be made to the above embodiments in terms of forms and details without departing from the spirit and scope of the present disclosure. Any person skilled in the art may make changes and modifications to the embodiments without departing from the spirit and scope of the present disclosure. Therefore, the protection scope of the present disclosure should be subject to the scope defined by the claims.

The invention claimed is:

1. A method of manufacturing a semiconductor structure, comprising:
   providing a base;
   forming active pillars, and a bit line that extends along a first direction, wherein the bit line is located on a surface of the base, the active pillars are arranged at intervals along a direction perpendicular to the surface of the base, the active pillars each comprise a source region, a channel region, and a drain region, and the bit line is electrically connected to one of the source region and the drain region of the active pillar;
   forming a word line extending along a second direction, wherein the word line is located between adjacent active pillars and surrounds the channel region of the active pillar;
   forming isolation layers and sacrificial layers, wherein the isolation layers are arranged at intervals along the direction perpendicular to the surface of the base, and each sacrificial layer is located between adjacent isolation layers;
   patterning end portions of the isolation layers and the sacrificial layers along a third direction, and thinning parts of the sacrificial layers along a width direction;
   forming a dielectric layer, wherein the dielectric layer is located on the surface of the base, the dielectric layer is further located between adjacent isolation layers, and along the third direction, the isolation layers are located between the word line and the dielectric layer, and removing the sacrificial layers; and
   forming a plurality of memory structures, wherein each memory structure is located between adjacent isolation layers; the memory structure comprises a first electrode plate, a medium layer, and a second electrode plate; the medium layer is located between the first electrode plate and the second electrode plate; the first electrode plate is electrically connected to the other of the source region and the drain region of the active pillar, and the first electrode plate surrounds a part of the second electrode plate.

2. The method of manufacturing the semiconductor structure according to claim 1, wherein process steps of forming the memory structure comprise:
   providing an initial base, and forming a first sacrificial film and a semiconductor film that are sequentially arranged at intervals on a surface of the initial base;
   forming the dielectric layer on the surface of the initial base, wherein the dielectric layer is located on a side surface of the first sacrificial film and a side surface of the semiconductor film;
   patterning the first sacrificial film, the semiconductor film, and the dielectric layer along the third direction, to form a first groove, wherein a bottom of the first groove exposes the initial base; and
   etching a part of the semiconductor film along a width direction to form a capacitive region, and sequentially forming the first electrode plate, the medium layer, and the second electrode plate in the capacitive region and the first groove, wherein the first sacrificial film is used for forming the isolation layer, and the semiconductor film is used for forming the active pillar.

3. The method of manufacturing the semiconductor structure according to claim 2, wherein the semiconductor film comprises a first semiconductor film and a second semiconductor film, the first semiconductor film and the second semiconductor film have different etching selectivity ratios, and the second semiconductor film is used for forming the active pillar; process steps of patterning the first sacrificial film, the semiconductor film, and the dielectric layer to form a first groove comprise:
   etching to remove the first semiconductor film, and forming a second sacrificial film, wherein the second sacrificial film is located between adjacent first sacrificial films;
   patterning the first sacrificial film and the second sacrificial film, to form a second groove, wherein a bottom of the second groove exposes the initial base; and
   forming the dielectric layer in the second groove; patterning the dielectric layer and the second sacrificial film along the third direction, to form the first groove, and removing the second sacrificial film to form the capacitive region.

4. The method of manufacturing the semiconductor structure according to claim 3, wherein along a direction parallel to the surface of the initial base, a width of the second groove ranges from 30 nm to 100 nm.

5. The method of manufacturing the semiconductor structure according to claim 2, wherein along a direction perpendicular to the surface of the initial base, a ratio of a thickness of the first sacrificial film to a thickness of the semiconductor film ranges from 10:1 to 1:1.

6. The method of manufacturing the semiconductor structure according to claim 2, wherein process steps of forming the first electrode plate comprise: forming a conductive layer on surfaces of the semiconductor film, the first sacrificial film, and the dielectric layer, and etching to remove the conductive layer located in the first groove, wherein the remaining conductive layer is used as the first electrode plate.

7. The method of manufacturing the semiconductor structure according to claim 2, wherein before the forming the memory structure, the method further comprises: forming a mask layer on a surface of a part of the first sacrificial film, wherein a material of the mask layer and a material of the first sacrificial film have different etching rates, and the material of the mask layer and a material of the semiconductor film have different etching rates.

8. The method of manufacturing the semiconductor structure according to claim 7, wherein the material of the mask layer comprises silicon nitride, silicon oxycarbonitride, silicon carbide, or silicon carbon oxide.

9. The method of manufacturing the semiconductor structure according to claim 1, wherein a material of the dielectric layer comprises silicon nitride, silicon oxycarbonitride, silicon carbide or silicon carbon oxide.

* * * * *